United States Patent [19]
Kin

[11] Patent Number: 6,051,285
[45] Date of Patent: Apr. 18, 2000

[54] PLASMA CVD METHOD AND PLASMA CVD APPARATUS

[75] Inventor: Yasunori Kin, Miyagi, Japan

[73] Assignee: Sony Corporation, Tokyo, Japan

[21] Appl. No.: 09/092,047

[22] Filed: Jun. 5, 1998

[30] Foreign Application Priority Data

Jun. 12, 1997 [JP] Japan .................................... 9-155420

[51] Int. Cl.[7] ....................................................... H05H 1/24
[52] U.S. Cl. ..................... 427/569; 427/577; 427/255.5; 427/453; 427/131; 427/398.2; 118/718; 118/723 E; 118/729
[58] Field of Search ..................................... 427/577, 569, 427/255.5, 249.7, 249.8, 130, 398.2, 131, 453; 118/723 E, 729, 718

[56] References Cited

U.S. PATENT DOCUMENTS

| | | | |
|---|---|---|---|
| 4,511,594 | 4/1985 | Yanai et al. ............................. | 427/132 |
| 5,302,424 | 4/1994 | Murai et al. ............................. | 427/131 |
| 5,338,577 | 8/1994 | Burdette, II ............................. | 427/453 |
| 5,585,139 | 12/1996 | Steininger et al. ...................... | 427/128 |
| 5,691,008 | 11/1997 | Thoma et al. ........................... | 427/531 |
| 5,900,283 | 5/1999 | Vakil et al. ............................. | 427/453 |

Primary Examiner—Roy V. King
Attorney, Agent, or Firm—Hill & Simpson

[57] ABSTRACT

A plasma CVD is provided for film formation in which a support member is sufficiently cooled so as to suppress thermal deformation and abnormal discharge, thus enabling to preferably carry out the film formation.

After a metal thin film is formed on a tape-shaped non-magnetic support member, the non-magnetic support member is made to travel continuously along a cooling can wile a thin film is formed on the metal thin film by way of the plasma CVD method, wherein the cooling can includes a metal can 12 having an outer circumferential surface which is entirely covered by an insulating layer 15 formed by a ceramic having a thickness of 0.3 to 1.0 mm.

6 Claims, 2 Drawing Sheets

PLASMA CVD METHOD AND PLASMA CVD APPARATUS

BACKGROUND OF THE INVENTION

1. Field of the Invention

The present invention relates to a plasma CVD method and a plasma CVD apparatus for film formation including a carbon protection film of a magnetic recording medium.

2. Description of the Prior Art

In a metal magnetic thin film type magnetic recording medium having a metal magnetic thin film as a magnetic layer, in order to improve the sliding property between the recording medium and a magnetic head, the metal magnetic thin film is normally covered with a hard type protection film.

Examples of this protection film include a carbon film, quartz ($SiO_2$) film, zirconia ($ZrO_2$) film, and the like. In particular, a great benefit can be expected from a diamond-like carbon (DLC) film having a diamond structure for its hardness and excellent protection property.

For forming this DLC film, for example, the plasma CVD (chemical vapor phase epitaxy) process is employed.

For forming a DLC film by way of the plasma CVD method, a tape-shaped plastic film (or support member) covered with a metal magnetic thin film is made to travel along a cylindrical can so as to pass over a reaction tube. This reaction tube is provided with a discharge electrode connected to a DC power source, so that a raw material gas introduced into the tube and passing this electrode is dissolved into plasma, generating plus ions. The plus ions generated here are directed toward a surface of the metal magnetic thin film traveling continuously along the cylindrical can and are accumulated there, forming a DLC film. It should be noted that the aforementioned cylindrical can has a width greater than the width of the support member so that the ends of the cylindrical can are exposed from both sides of the support member. This is to cope with any traveling fluctuation of the support member in the width direction as well as width fluctuations of the support member itself.

When forming a film by way of the plasma CVD method, the support member traveling over the reaction tube may be heated up to the order of 60 to 70° C. by the plasma heat and the electrode heating. On the other hand, a plastic film made from, for example, polyethylene terephthalate or the like has a heat resistance of 60 to 70° C., and if heated as has been described above, it may be deformed.

For this, in the plasma CVD method, such a thermal deformation is avoided by providing a cooling function in the cylindrical can and by forming the cylindrical can itself from a metal of a high thermal conductivity such as a stainless roll plated by chrome.

However, when a cylindrical can is made from a conductive body such as a metal, the exposed portions of the cylindrical can are easily subjected to the flow of plasma and plus ions, causing an abnormal discharge. As a result, there arise problems that the film formation is deteriorated and the cylindrical can is damaged.

SUMMARY OF THE INVENTION

It is therefore an object of the present invention to provide a plasma CVD method and a plasma CVD apparatus causing no thermal deformation of a support member or tape-shaped plastic film and no abnormal discharge.

In order to achieve the aforementioned object, the plasma CVD method according to the present invention is carried out as follows. After a metal thin film is formed on a tape-shaped non-magnetic support member, the support member is made to travel continuously along a cooling can including a metal can having an outer circumferential surface which is entirely covered with an insulating layer formed by an insulating ceramic having a thickness of 0.3 to 1.0 mm.

Moreover, the plasma CVD apparatus according to the present invention includes a cooling can and a reaction tube for carrying out a chemical reaction by a raw material gas by plasma, wherein the cooling can includes a metal can having an outer circumferential surface which is entirely covered by an insulating layer formed from an insulating ceramic having a thickness of 0.3 to 1.0 mm.

If a cylindrical can has an outer circumferential surface which is entirely covered with a predetermined thickness of an insulating layer made from an insulating ceramic, it is possible to prevent the flow of plasma and plus ions into the cylindrical can, which in turn suppresses abnormal discharge. Moreover, because the insulating ceramic has a higher heat conductivity than an insulating resin or the like, an effective heat exchange is carried out via the insulating layer between a cooling apparatus of the cylindrical can and the support member, thus cooling the support member. Consequently, it is possible to carry out a preferable film formation while preventing thermal deformation of the support member.

DETAILED DESCRIPTION OF PREFERRED EMBODIMENTS

Hereinafter, the description will be directed to embodiments of the present invention with reference to the attached drawings.

For forming a CVD film by way of the plasma CVD method according to the present invention, firstly, a metal thin film is formed on a support member.

For example, when producing a magnetic recording medium, the support member may be made from a polyester resin such as polyethylene terephthalate and polyethylene naphthalate, a polyolefin rein, cellulose derivative such as cellulose triacetate, a polycarbonate resin, polyvinyl chloride resin, a polyamide resin, and other high molecular substances. Moreover, these non-magnetic support members, prior to formation of a magnetic thin film, may be subjected to a surface processing and a pre-processing for facilitating bonding, improving the surface property, coloring, preventing charge, giving abrasion resistance, and the like.

The magnetic thin film is formed by the so-called PVD technique such as a vacuum deposition method in which a ferromagnetic metal material is heated to be evaporated in a vacuum so as to be deposited on a non-magnetic support member; an ion plating method which carries out evaporation of the ferromagentic metal material in a discharge; and a sputter method which causes glow discharge in an argon atmosphere so that the argon ions generated know out atoms from a target surface.

The ferromagnetic metal material may be Co, Co—Pt alloy, Co—Ni—Pt alloy, Fe—Co alloy, Fe—Co—Ni alloy, Fe—Co—B alloy, Fe—Co—Ni—B alloy, Co—Cu alloy, Fe—Cu alloy, Co—Au alloy, Fe—Cr alloy, Ni—Cr alloy, Fe—Co—Cr alloy, Co—Ni—Cr alloy, and the like.

On this metal thin film is formed a film by way of the plasma CVD method.

Figure 1:
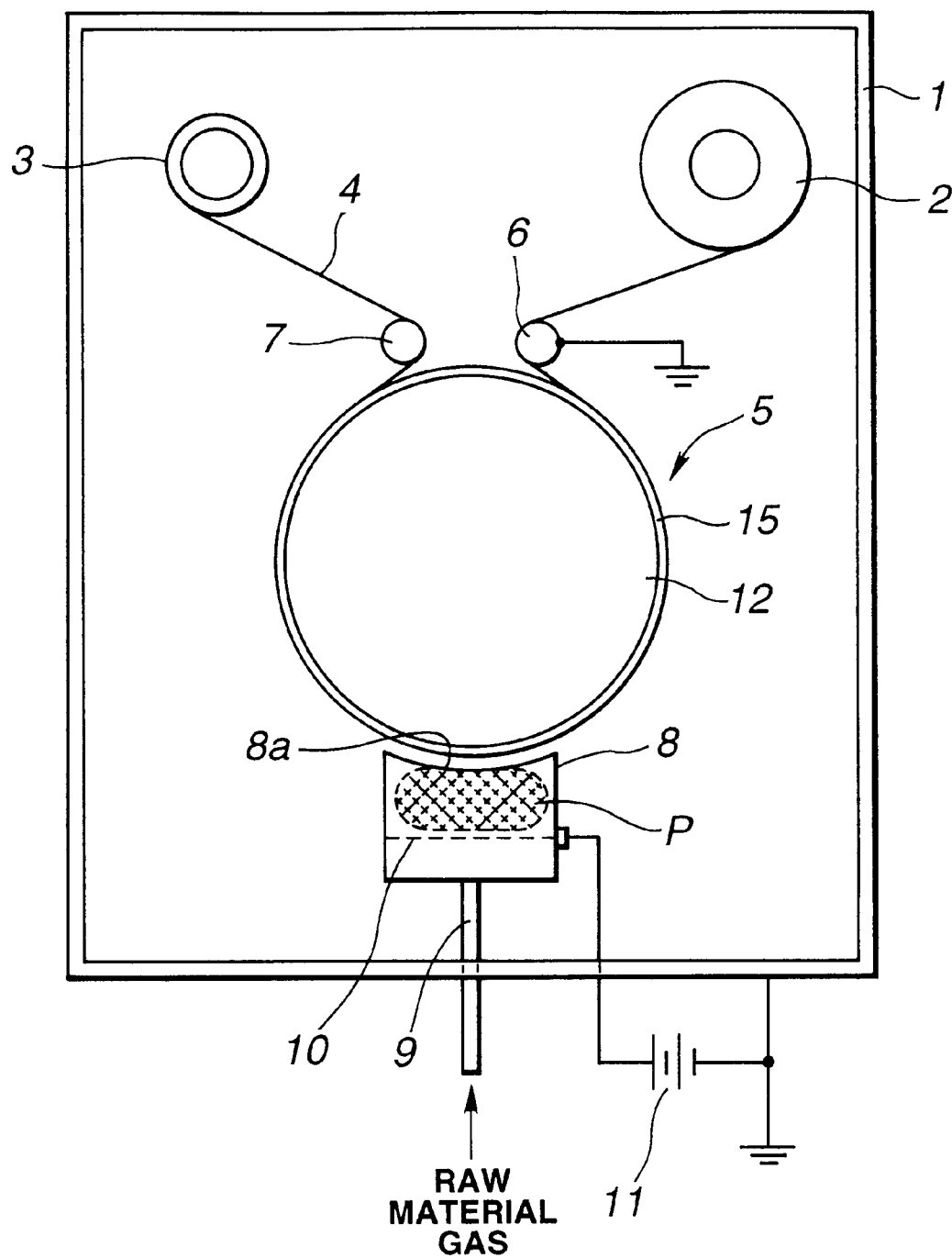
FIG. 1 schematically shows an example of a plasma CVD apparatus according to the present invention.

FIG. 1 shows a plasma CVD apparatus for carrying out this film formation.

This CVD apparatus includes: a vacuum chamber 1 whose interior is in a high vacuum state; a feed roll 2 which rotates at a constant speed clockwise in the figure; wind-up roll 3 which also rotates at a constant speed clockwise in the figure; and a tape-shaped non-magnetic support member 4 which travels from the feed roll 2 toward the wind-up roll 3.

In the middle of the traveling path way of the non-magnetic support member 4 from the feed roll 2 to the wind-up roll 3, there is provided a cylindrical can 5 having a diameter larger than the rolls 2 and 3. This cylindrical can 5 has a cooling function so as to suppress deformation or the like caused by temperature increase of the non-magnetic support member 4.

This cylindrical can 5 is rotated clockwise in the figure at a constant speed so as to pull out the non-magnetic support member 4 downward in the figure. It should be noted that the cylindrical can 5 has a width slightly greater than the width of the support member 4 and the ends of the cylindrical can 5 are exposed from both sides of the support member 4. This is because the support member 4 fluctuates during its traveling and the support member itself has fluctuations in the width direction.

In the CVD apparatus having the aforementioned configuration, the non-magnetic support member 4 is continuously fed out from the feed roll 2 so as to travel along the circumferential surface of the cylindrical can 5 and wound up by the wind-up roll 3. Note that a guide roll 6 is provided between the feed roll 2 and the cylindrical can 5; and a guide roll 7 is provided between the cylindrical roll and the wind-up roll 3, so that a predetermined tension is applied to the non-magnetic support member 4 traveling from the feed roll 2 and along the cylindrical can 5, reaching the wind-up roll 3, enabling the non-magnetic support member 4 to travel smoothly. Note that one of the guide rolls, i.e., the guide roll 6 is grounded, so that the metal thin film formed on the non-magnetic support member 4 serves as a grounding electrode.

On the other hand, below the cylindrical can 5, there is provided a reaction tube 8.

The reaction tube 8 is a hollow tube having a cavity of rectangular cross section. The reaction tube 8 has an opening 8a facing the cylindrical can 5 and a bottom through which a gas introduction tube 9 extends, so that a raw material gas is introduced through this gas introduction tube 9 into the reaction tube 8. Moreover, at the side of the opening 8a, this reaction tube 8 has an end curved into an arc shape matched with the circumferential configuration of the cylindrical can 5 in the longitudinal direction of the non-magnetic support member.

In the reaction tube 8 having the aforementioned configuration, there is provided a discharge electrode 10 consisting of a metal mesh or the like. An electric potential is applied from an external DC power source 11 to this discharge electrode 10, so as to generate a voltage between the discharge electrode 10 and the metal thin film serving as the grounding electrode. In this reaction tube 8, the raw material gas introduced into this tube becomes plasma P when passing through the electrode and is dissolved, generating plus ions. The plus ions generated are oriented toward the surface of the metal magnetic thin film traveling along the cylindrical can and accumulated, forming a CVD film.

This is the basic configuration of the plasma CVD apparatus. The cylindrical can 5 used in this method has an insulating layer 15 made from insulating ceramic with a thickness of 0.3 to 1.0 mm so as to cover the entire outer circumferential surface of the metal can.

Figure 2:
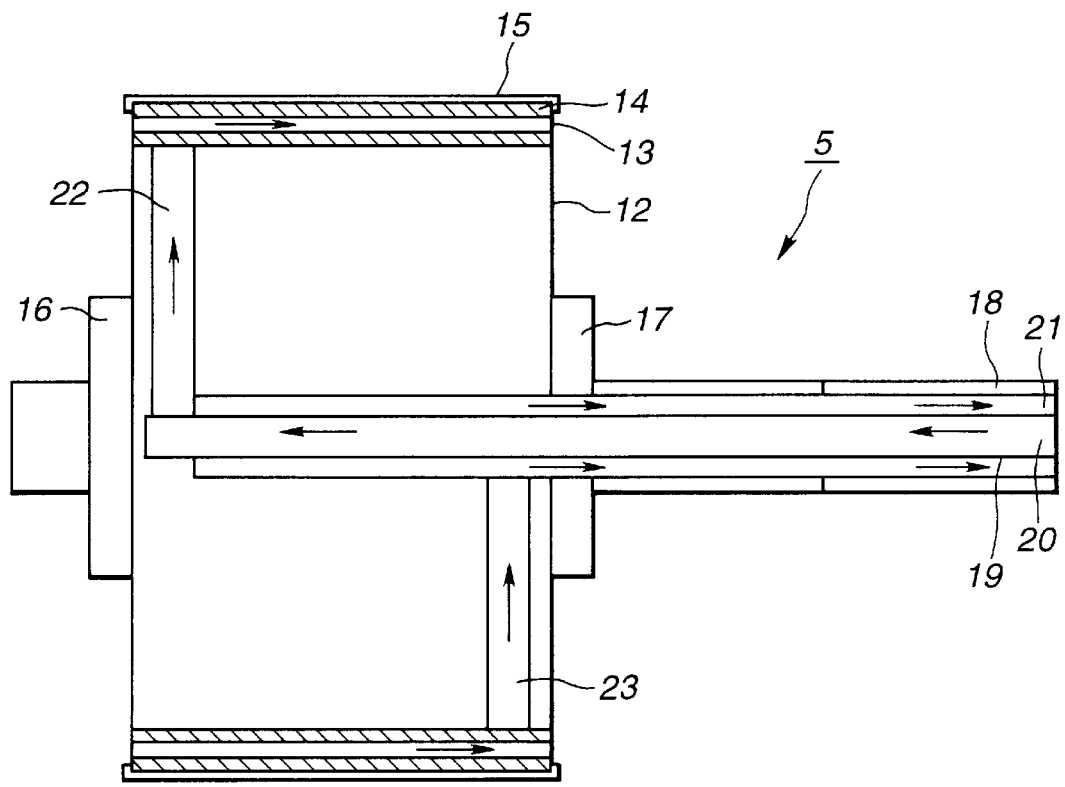
FIG. 2 schematically shows an example of a cylindrical can provided in the aforementioned plasma CVD apparatus.

As shown in FIG. 2 the cylindrical can has a cylindrical metal can 12 made from stainless steel or the like as an inner layer and, over its outer circumference, there is provided a metal layer 14 formed as an outer layer and between which is provided a coolant passage 13. The entire surface of the metal layer 14 is covered by an insulating layer 15 made from an insulating ceramic. A rotation drive shaft 16 and a rotation following shaft 17 are provided coaxial with the cylinder. Through the rotation following shaft, there is provided a first coolant flow tube 18 which communicates with the aforementioned coolant passage 13. This first coolant flow tube 18 has a double-passage configuration consisting of an inner coolant passage 20 and an outer coolant passage which are separated from each other by a wall 19. The inner coolant passage 20 communicates with the coolant passage 13 of the cylindrical can 5 via a second coolant flow tube 22 provided at one end of the cylinder where the rotation drive shaft 16 is mounted. Moreover, the outer coolant passage 21 communicates with the coolant passage 13 of the cylindrical can 5 via a third coolant flow tube 23 provided at the other end the cylinder where the rotation following shaft 17 is mounted.

In this cylindrical can 5, a coolant cooled to about −30° C. for example is supplied through the inner coolant passage 21 of the first coolant tube 18, so as pass through the second coolant tube 22, reaching the coolant passage 13. The coolant supplied to the coolant passage 13 flows along the cylindrical circumferential surface toward the third coolant tube 23 and flows into the third coolant tube 23. The coolant in the third coolant tube 23 flows out passing through the outer coolant passage 21 of the first coolant tube 18.

The support member passing over the cylindrical can having the aforementioned configuration is cooled by heat exchange between the circulating coolant and the metal layer 14 and the insulating layer 15. Here, the insulating ceramic constituting the insulating layer 15 has a higher heat conductivity than the previously used insulating resin or the like and accordingly, an effective heat exchange is carried out between the coolant passing through the coolant passage 13 of the cylindrical can 5 and the support member, enabling a cool down of the support member. Consequently, it is possible to prevent deformation of the support member by heat.

Moreover, since the cylindrical can 5 has the insulating layer 15 which covers the entire outer circumferential surface of the cylinder, it is possible to prevent plasma and plus ions from flowing into the cylindrical can 5, thus suppressing abnormal discharge.

It is important that the insulating layer 15 has a thickness of 0.3 to 1.0 mm. If the thickness of the insulating layer 15 is below 0.3 mm, it is impossible to obtain sufficient insulation. Moreover, if the insulating layer 15 has a thickness above 1.0 mm, the insulating layer 15 becomes cracked because of the differences in the thermal expansion ratio of the metal layer 14 and the insulating layer 15. Note that a preferred thickness of the insulating layer 15 is 0.5 to 0.7 mm.

This insulating layer 15 is not limited to a particular type of ceramic so long as it is a ceramic layer having an insulation property. Preferably there is provided a ceramic layer containing alumina as a main constituent.

Moreover, the insulating layer 15 is preferably formed, for example, by a ceramic spray method. In particular, it is preferable that the insulating layer 15 be formed by the ceramic spray method using plasma powder spray.

In the plasma powder spray method, an N2 gas, H2 gas, and inactive gas, or the like is ionized to generate a plasma jet of high temperature and high speed which is fed with a material powder to be used for coating so that the material is melted and heated before it strikes against a base material (a metal in this case), so as to form a film. Because this plasma jet is at an extremely high temperature, this method can be preferably used to spray a substance having a high melting point such as ceramics and enables formation of a dense and smooth insulating layer.

Moreover, it is possible to form the insulating layer 15 by the ceramic spray method using the Rokide rod spray method.

The Rokide rod spray method is performed by melting a sintered ceramic rod in an atmosphere of oxygen and ethylene at about 3000° C. and the molten droplets obtained are accelerated by an air jet flow to be sprayed toward the base material, so as to form a film. In this method, only the ceramic particles which are completely melted are sprayed and it is possible to obtain a film having a high bonding strength between the particles.

When forming an insulating layer containing alumina as a main constituent by way of such ceramic spray method, as the molten spray material it is possible to use a so-called white alumina consisting of $Al_2O_3$ added by $SiO_2$, CaO, MgO, $Fe_2O_3$, or the like, and a so-called gray alumina consisting of $Al_2O_3$ added by $TiO_2$, $SiO_2$, $Fe_2O_3$, CaO, MgO, or the like.

In actual operation, a white alumina was used having a composition containing 98.5 weight % of $Al_2O_3$ and 1.0 weight % of $SiO_2$ as the melting material and an insulating layer of 0.5 mm thickness was prepared by the ceramic spray method using a plasma powder spray (produced by Japan Coating Kogyou Co., Ltd.). The insulating layer had insulation characteristic capable of withstanding a voltage equal to or above 3 kV and it was possible to obtain a cooling effect of −10° C. or below.

It should be noted that this insulating layer 5 preferably has a surface roughness Ra equal to or below 0.15 μm and a surface roughness Rz equal to or below 1.0 μm. Here, the surface roughness Ra and Rz are those specified by JIS B0601: the surface roughness Ra is the center line average roughness; and the surface roughness Rz is a 10-point average roughness.

Moreover, it is possible to provide a backing layer below the insulating layer 15, so as to prevent cracks which may be generated in the insulating layer 15 by the difference in the thermal expansion ratio. As this backing layer, it is preferable to use an alloy film such as Ni—Cr, Ni—Cr—Al, Ni—Al, and the like.

In order to confirm the effect of this backing layer, 4 types of cylindrical cans were prepared covered with a Ni—Cr backing layer and/or insulating layer having thicknesses as shown in FIG. 1. Each of the cylindrical cans was heated in an electric furnace adjusted to about 500° C. and then cooled down, after which it was observed for cracks by a visual check. Note that the insulating layer was prepared by using a white alumina as the melting material and by way of the ceramic spray method using the plasma powder spray.

TABLE 1

|  | Thickness of Backing layer (mm) | Thickness of Insulating layer (mm) |
| --- | --- | --- |
| Sample 1 | 0.2 | 0.3 |
| Sample 2 | 0.2 | 0.5 |
| Sample 3 | None | 0.5 |
| Sample 4 | None | 0.7 |

As a result, it was confirmed that cracks are easily generated in Samples 3 and 4 each having only an insulating layer but cracks are prevented in Samples 1 and 2 each having a backing layer. That is, the backing layer has a significant beneficial effect.

In this plasma CVD apparatus, film formation is carried out as has been described above. By selecting a raw material gas, it is possible to form various CVD films. For example, in order to form a carbon protection film as a protection film over the magnetic recording medium, a gas containing carbon is used as the raw material gas.

As the gas which contains carbon, it is possible to use a hydrocarbon gas such as methane, ethylene, and butane, or a so-called organic solvent such as toluene and ketone which have been gasified. Moreover, in order to give a lubrication property to the protection film, it is also possible to use an organic material containing amine, fluorine, silicone, or the like as the raw material gas. The amine may be isopropylamine, triethylamine, dimethylamine, and the like. These can be dissolved in an organic solvent such as toluene and the gasified. Moreover, as a gas which contains fluorine or silicone, there can be exemplified a carbon fluoride gas such as ethylene fluoride, an organic silicone compound (silicone) gas, or an organic silicone fluoride gas. These raw material gases may be used in combination so as to provide the required characteristics of the medium, or it is also possible to use different raw material gas to form a plurality of protection films layered on one another.

As is clear from the aforementioned, according to the present invention, a metal thin film is formed on a tape-shaped non-magnetic support member and the non-magnetic support member is continuously made to travel along a cooling can while a thin film is formed on the metal thin film by way of the plasma CVD method, wherein the cooling can has an outer circumferential surface covered with an insulating layer made from an insulating ceramic having a thickness of 0.3 to 1.0 mm, which sufficiently cools down the support member and prevents abnormal discharge. Consequently, it is possible to carry out a film formation by CVD in a preferable state without causing deformation of the support member.

What is claimed is:

1. A plasma CVD method for forming a thin film on metal thin film formed on a tape-shaped non-magnetic support member, comprising the steps of:
    continuously moving said tape-shaped non-magnetic support member along a cooling can;
    providing as said cooling can a metal can having an outer circumferential surface which is entirely covered with an insulating ceramic having a thickness of 0.3 to 1.0 mm.

2. A plasma CVD method as claimed in claim 1, wherein said insulating ceramic is formed by spraying a ceramic onto said metal can.

3. A plasma CVD method as claimed in claim 1, wherein said insulating ceramic is formed by spraying a ceramic onto said metal can.

4. A plasma CVD method as claimed in claim 1, wherein said metal thin film on the non-magnetic support member is a deposited magnetic film.

5. A plasma CVD method as claimed in claim 1, wherein said thin film to be formed is a carbon film.

6. A plasma CVD apparatus, comprising:

a cooling can and a reaction tube for carrying out a chemical reaction of a raw material gas by using plasma, wherein a thin film is formed by depositing a reaction product obtained in said reaction tube, on a metal thin film formed on a non-magnetic support member which travels along said cooling can, said cooling can includes a metal can having an outer circumferential surface which is entirely covered by an insulating ceramic having a thickness of 0.3 to 1.0 mm.

* * * * *